(12) United States Patent
Okuda et al.

(10) Patent No.: US 8,707,715 B2
(45) Date of Patent: Apr. 29, 2014

(54) THERMOELECTRIC CONVERSION UNIT

(75) Inventors: Motoaki Okuda, Kariya (JP); Naoya Yokomachi, Kariya (JP); Hiromi Ueda, Kariya (JP); Junki Nakamura, Kariya (JP)

(73) Assignee: Kabushiki Kaisha Toyota Jidoshokki, Aichi-Ken (JP)

( * ) Notice: Subject to any disclaimer, the term of this patent is extended or adjusted under 35 U.S.C. 154(b) by 150 days.

(21) Appl. No.: 13/416,422

(22) Filed: Mar. 9, 2012

(65) Prior Publication Data

US 2012/0240596 A1 Sep. 27, 2012

(30) Foreign Application Priority Data

Mar. 25, 2011 (JP) ................. 2011-066947

(51) Int. Cl.
*F25B 21/02* (2006.01)
(52) U.S. Cl.
USPC .............................................. 62/3.2
(58) Field of Classification Search
USPC .................... 62/3.2, 3.3, 3.7, 295.2
See application file for complete search history.

(56) References Cited

U.S. PATENT DOCUMENTS

| | | | |
|---|---|---|---|
| 5,931,001 A | 8/1999 | Watanabe et al. | |
| 7,797,960 B2 * | 9/2010 | Onoue | 62/259.2 |
| 2002/0062649 A1 * | 5/2002 | Ohkubo et al. | 62/3.7 |
| 2004/0144523 A1 | 7/2004 | Higashiyama | |
| 2007/0051400 A1 | 3/2007 | Aoki et al. | |
| 2007/0209787 A1 | 9/2007 | Hiyama | |
| 2007/0291234 A1 * | 12/2007 | Momose et al. | 353/52 |
| 2008/0110608 A1 | 5/2008 | Gorbounov et al. | |
| 2011/0017439 A1 | 1/2011 | Carloff et al. | |

FOREIGN PATENT DOCUMENTS

| | | |
|---|---|---|
| CN | 1174314 | 2/1998 |
| CN | 1537219 | 10/2004 |
| CN | 101532792 | 9/2009 |
| EP | 1804015 | 7/2007 |
| JP | 9-172203 | 6/1997 |
| JP | 9-280772 | 10/1997 |
| JP | 11112040 | 4/1999 |
| JP | 2001-004245 | 1/2001 |
| JP | 2001165525 | 6/2001 |
| JP | 2003-148148 | 5/2003 |

(Continued)

OTHER PUBLICATIONS

EPO Search Report dated Jun. 17, 2013.

(Continued)

*Primary Examiner* — Melvin Jones
(74) *Attorney, Agent, or Firm* — Greenblum & Bernstein, P.L.C.

(57) ABSTRACT

A thermoelectric conversion unit includes first and second cases including first and second recesses that define first and second flow passages and have openings, first and second substrates, a plurality of thermoelectric devices in contact with inner surfaces of the first and second substrates, a connector for joining the first and second cases, first and second fins protruding from the first and second substrates in the first and second flow passages. The first and second cases include first and second opposed portions opposed to the first and second substrates outside the first and second recess, respectively. A spacer for setting distance between the first opposed portion and the second opposed portion is provided. The spacer sets the distance between the first and second opposed portions to be longer than distance between the outer surface of the first substrate and the outer surface of the second substrate.

7 Claims, 5 Drawing Sheets

(56) References Cited

FOREIGN PATENT DOCUMENTS

| | | |
|---|---|---|
| JP | 2004-347137 | 12/2004 |
| JP | 2006136188 | 5/2006 |
| JP | 2007221895 | 8/2007 |
| JP | 2007-275800 | 10/2007 |
| WO | 02086980 | 10/2002 |
| WO | 03071198 | 8/2003 |
| WO | 2004054007 | 6/2004 |

OTHER PUBLICATIONS

Japanese Office action, mail date is Nov. 12, 2013.
U.S. Appl. No. 13/416,224 to Motoaki Okuda et al., which was filed on Mar. 9, 2012.
Chinese Office action, dated Nov. 4, 2013 along with an English-language translation thereof.
Chinese Office action, dated Dec. 13, 2013 along with an English-language translation thereof.

* cited by examiner

THERMOELECTRIC CONVERSION UNIT

BACKGROUND OF THE INVENTION

The present invention relates to a thermoelectric conversion unit.

A thermoelectric conversion unit described in Japanese Laid-Open Patent Publication No. 9-172203 includes a thermoelectric module and a housing. The thermoelectric module includes a thermoelectric device having a first heat exchange and a second heat exchange surface, a first heat exchange member brought into contact with the first heat exchange surface of the thermoelectric device, first fins protruding from the first heat exchange member, a second heat exchange member brought into contact with the second heat exchange surface, and second fins protruding from the second heat exchange member. A through hole that the second fins penetrate and an accommodating recess disposed on the periphery of the through hole are formed in the housing. The accommodating recess accommodates the second substrate and the thermoelectric device. The first substrate covers the accommodating recess, and the outer circumference portion of the first substrate is attached to the housing with screws.

SUMMARY OF THE INVENTION

However, a need exists for a unit having a first case in which a flow passage for feeding a heat medium to one side of the thermoelectric module is formed and a second case in which a flow passage for feeding a heat medium to the other side of the thermoelectric module is formed. A structure where the thermoelectric module can be held rotationally in the unit is also required.

In one aspect of the invention, a thermoelectric conversion unit is provided. The thermoelectric conversion unit comprises: a first case including a first recess, wherein the first recess defines a first flow passage and has an opening; a second case including a second recess, wherein the second recess defines a second flow passage and has an opening; a first substrate covering the opening of the first recess, wherein the first substrate includes an inner surface and an outer surface; a second substrate opposed to the first substrate and covering the opening of the second recess, wherein the second substrate includes an inner surface and an outer surface; a plurality of thermoelectric devices in contact with the inner surfaces of the first and second substrates; a connector for joining the first and second cases; a first fin protruding from the first substrate in the first flow passage of the first case; and a second fin protruding from the second substrate in the second flow passage of the second case. The first case includes a first opposed portion opposed to the first substrate outside the first recess. The second case includes a second opposed portion opposed to the second substrate outside the second recess. An accommodating recess is formed in at least one of the first and second opposed portions. The accommodating recess has a bottom portion. An elastic member is housed in the accommodating recess. The elastic member makes contacts with both the bottom portion of the accommodating recess and the outer surface of the first substrate or both the bottom portion of the accommodating recess and the outer surface of the second substrate. A spacer for setting distance between the first opposed portion and the second opposed portion is provided. The spacer sets the distance between the first and second opposed portions to be longer than distance between the outer surface of the first substrate and the outer surface of the second substrate.

DESCRIPTION OF THE PREFERRED EMBODIMENTS

Figure 1:
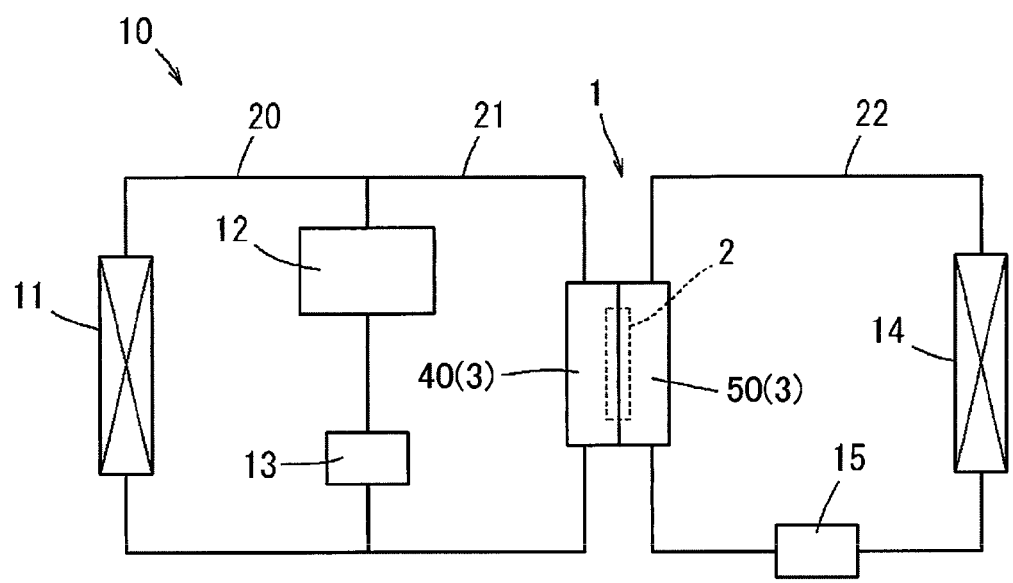
FIG. 1 is a block diagram of a heat exchange system.

An embodiment of the present invention will be described with reference to FIGS. 1 to 7. As illustrated in FIG. 1A, a heat exchange system 10 is provided for a vehicle, for example, and includes a heat exchanger or a thermoelectric conversion unit 1, a radiator 11, and an indoor heat exchanger 14. The radiator 11 is connected to an engine 12 of the vehicle by a pipe 20. A pump 13 provided in the middle of the pipe 20 circulates a first heat medium (coolant fluid).

As illustrated in FIG. 1, the thermoelectric conversion unit 1 is connected to the radiator 11 in parallel with the engine 12 by a pipe 21 connected to the pipe 20. The first heat medium is cooled by receiving cold from the thermoelectric conversion unit 1 via the pipes 20 and 21. Therefore, the first heat medium can be cooled by not only the radiator 11 but also the thermoelectric conversion unit 1.

As illustrated in FIG. 1, the thermoelectric conversion unit 1 is connected by a pipe 22 to the indoor heat exchanger 14. A pump 15 provided in the middle of the pipe 22 circulates a second heat medium (coolant fluid) between the thermoelectric conversion unit 1 and the indoor heat exchanger 14. The second heat medium receives heat from the thermoelectric conversion unit 1 to release the heat from the indoor heat exchanger 14 to indoor air. Therefore, it is possible to heat the interior by the indoor heat exchanger 14.

Figure 2:
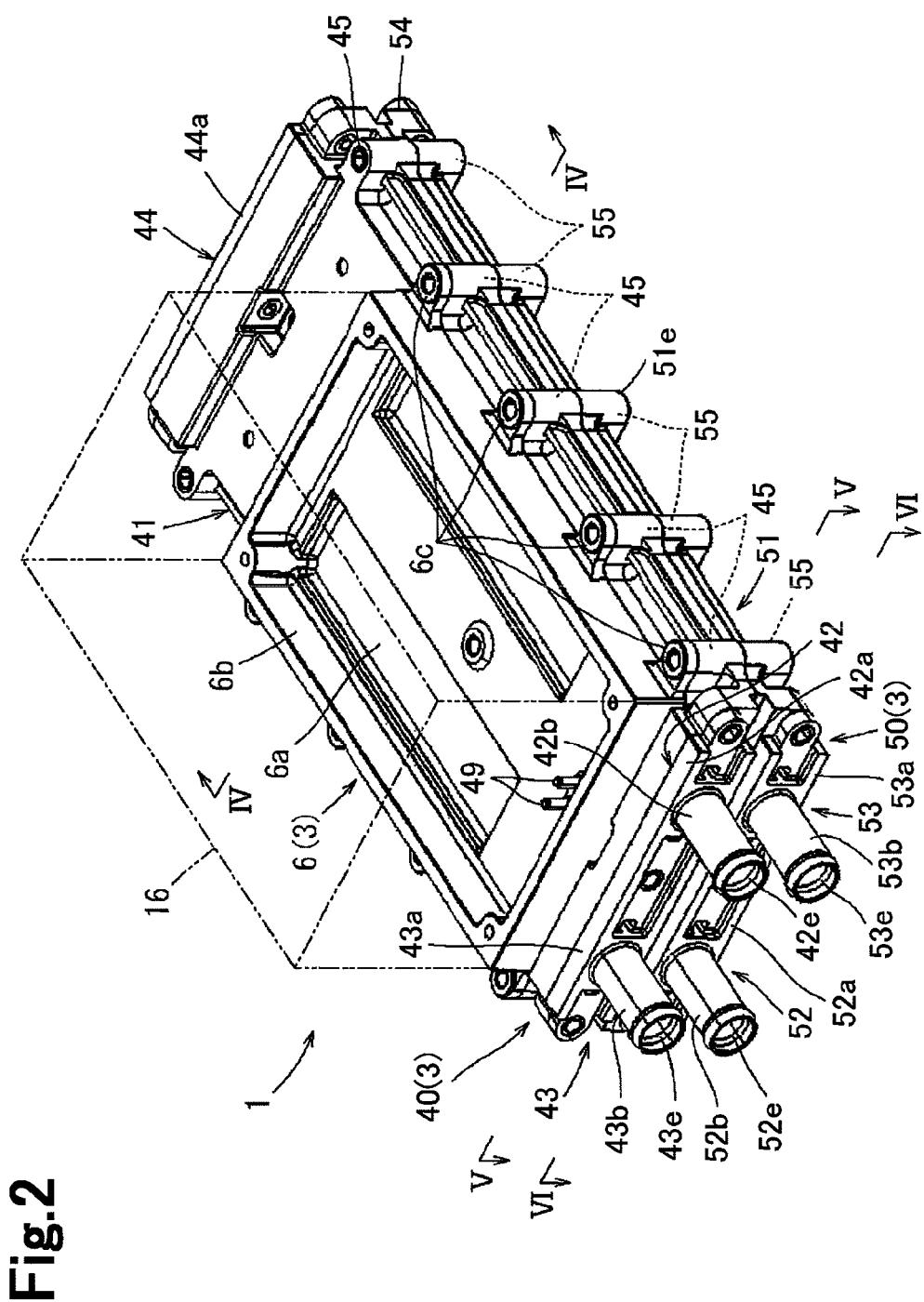
FIG. 2 is a perspective view of the thermoelectric conversion unit.
Figure 3:
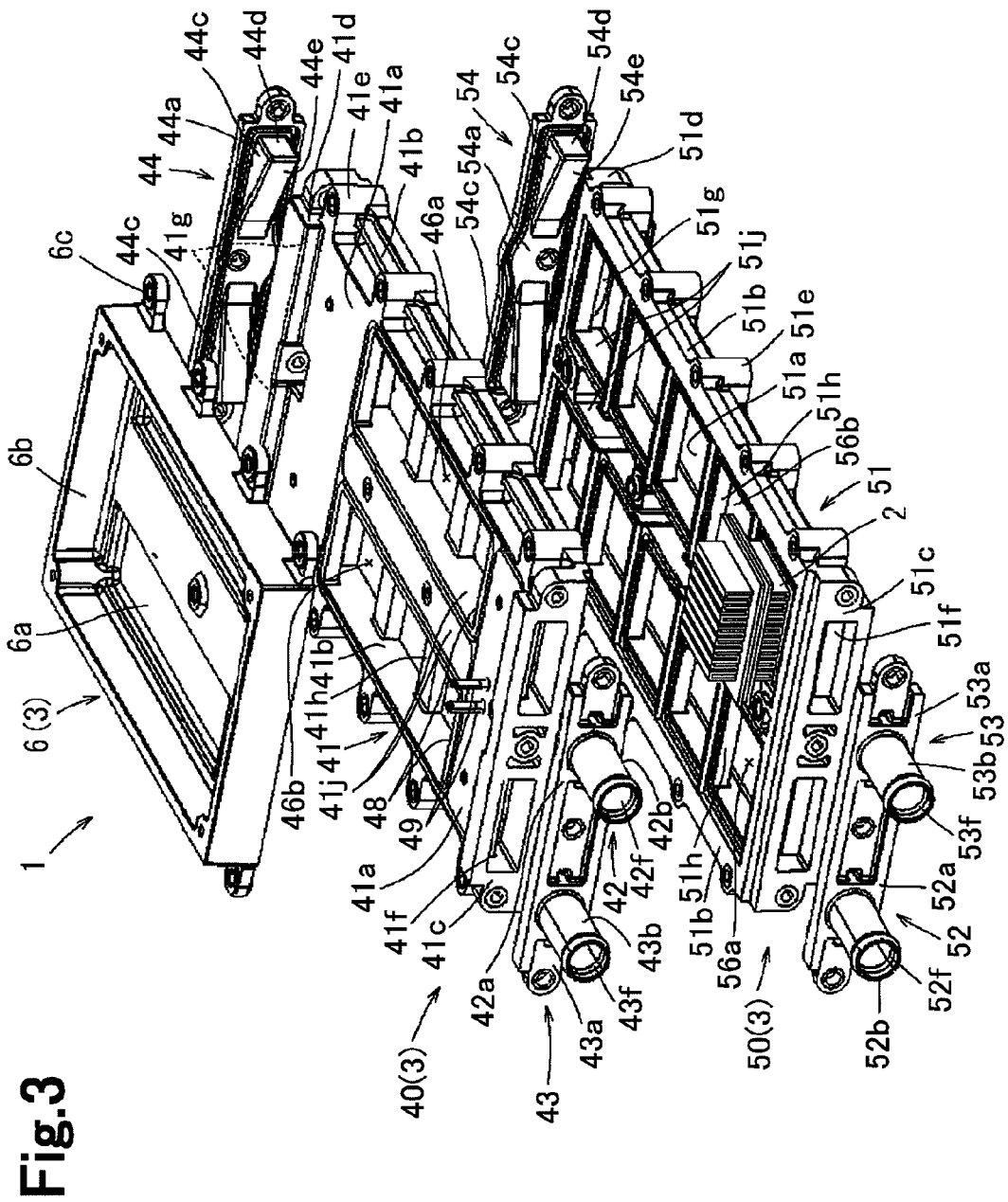
FIG. 3 is an exploded perspective view of the thermoelectric conversion unit.

As illustrated in FIGS. 2 and 3, the thermoelectric conversion unit 1 includes a housing 3 and a plurality of Peltier modules (thermal members) 2 provided in the housing 3. The housing 3 includes a first case 40, a second case 50, and a converter case 6, which are stacked in the thickness direction.

Figure 4:
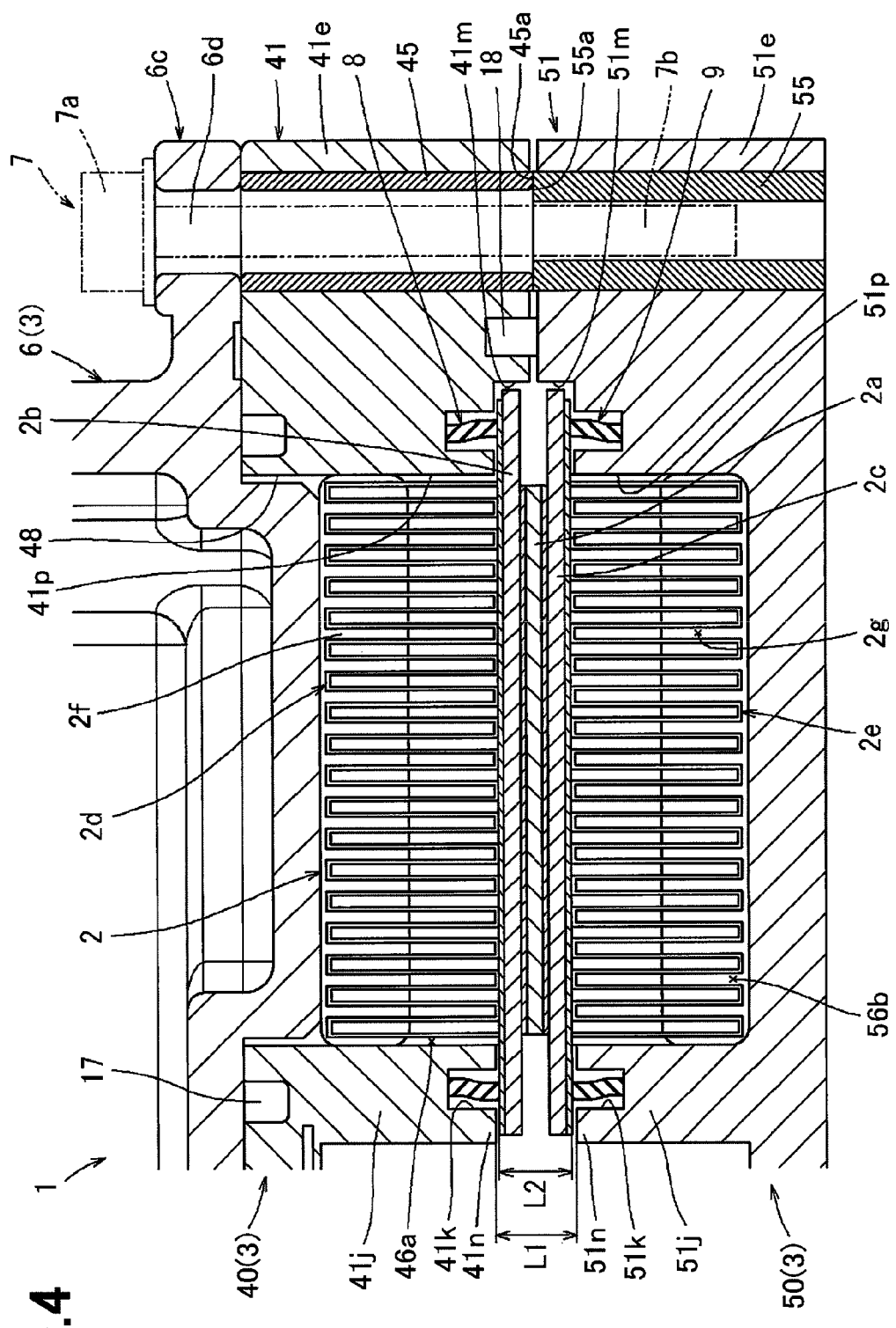
FIG. 4 is a cross-sectional view taken along the line IV-IV of FIG. 2.
Figure 5:
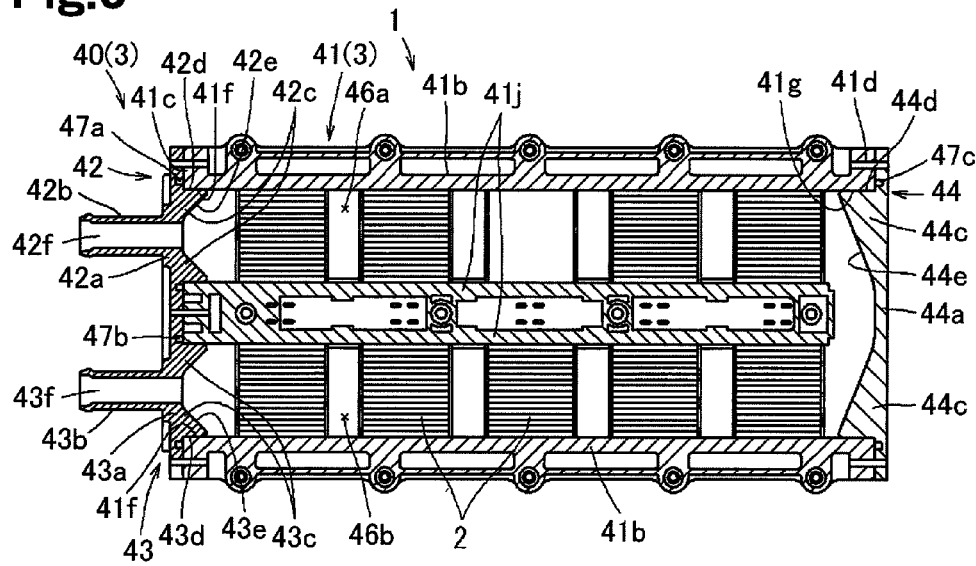
FIG. 5 is a cross-sectional view taken along the line V-V of FIG. 2.

As illustrated in FIGS. 3 and 5, the first case 40 includes a case body 41. The case body 41 is made of resin and molded with a molding die. The case body 41 includes a top portion 41a, side walls 41b extending downward from edges on both sides of the top portion 41a, a front wall 41c extending downward from a front edge of the top portion 41a, and a back wall 41d extending downward from a back edge of the top portion 41a that are integrally formed. A pair of partition plates 41j are formed on the top portion 41a to extend from the front edge to the back edge to partition the inside of the first case 40. A plurality of parallel flow passages (first flow passages) 46a and 46b are formed by the partition plates 41j in the first case 40. In other words, the flow passages 46a and 46b are defined by a first recess 41p provided in the first case 40 as illustrated in FIG. 4.

Figure 6:
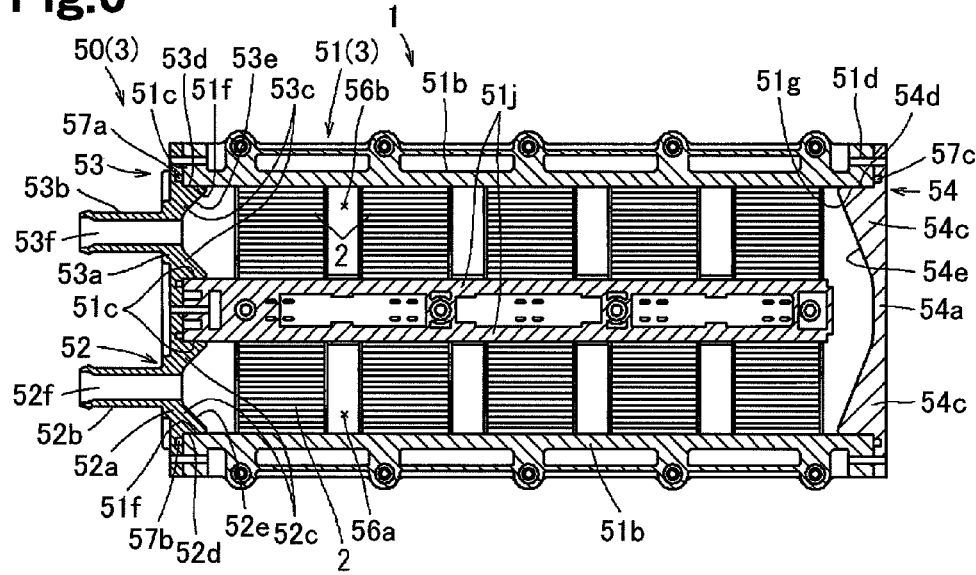
FIG. 6 is a cross-sectional view taken along the line VI-VI of FIG. 2.

As illustrated in FIGS. 3 and 6, the second case 50 includes a case body 51. The case body 51 is made of resin and molded with a molding die. The case body 51 includes a bottom portion 51a, side walls 51b extending upward on edges on both sides of the bottom portion 51a, a front wall 51c extending upward on a front edge of the bottom portion 51a, and a back wall 51d extending upward on a back edge of the bottom portion 51a that are integrally formed. A pair of partition plates 51j are formed on the bottom portion 51a to extend from the front edge to the back edge to partition the inside of the second case 50. A plurality of parallel flow passages (second flow passages) 56a and 56b are formed by the partition plates 51j in the second case 50. In other words, the flow passages 56a and 56b are defined by a second recess 51p that is provided in the second case 50 as illustrated in FIG. 4.

As illustrated in FIGS. 3, 5 and 6, the case bodies 41 and 51 include beams 41h and 51h extending between the partition plates 41j and 51j and the side walls 41b and 51b. The beams 41h and 51h are apart from the top portion 41a and the bottom portion 51a respectively to avoid the blockage of the flow passages 46a, 46b, 56a and 56b. The case bodies 41 and 51 are partitioned into a plurality of accommodating areas (for example, 10 accommodating areas) by the beams 41h and 51h, the partition plates 41j and 51j, and the side walls 41b and 51b. The upper part of each thermoelectric module 2 is housed in each accommodating area of the case body 41. The lower part of each thermoelectric module 2 is housed in each accommodating area of the case body 51.

As illustrated in FIGS. 3, 5 and 6, first openings 41f and 51f communicating with the flow passages 46a, 46b, 56a and 56b are formed in the front walls 41c and 51c. Guide members 42 and 52 and discharge members 43 and 53 are attached to the front walls 41c and 51c. Second openings 41g and 51g communicating with the flow passages 46a, 46b, 56a and 56b are provided in the back walls 41d and 51d. Return members 44 and 54 are attached to the back walls 41d and 51d.

As illustrated in FIGS. 3, 5 and 6, the guide members 42 and 52 and the discharge members 43 and 53 are made of resin and molded with a molding die. The guide members 42 and 52 and the discharge members 43 and 53 include plate portions 42a, 43a, 52a, and 53a attached to the front walls 41c and 51c. The plate portions 42a and 52a and the plate portions 43a and 53a are integrally molded.

As illustrated in FIGS. 3, 5 and 6, the guide members 42 and 52 include guide tubes 42b and 52b protruding from the plate portions 42a and 52a. Guide channels 42f and 52f communicating with the first flow passages 46a and 56a on the inlet side are formed in the guide tubes 42b and 52b and the plate portions 42a and 52a. The discharge members 43 and 53 include discharge tubes 43b and 53b protruding from the plate portions 43a and 53a. Discharge channels 43f and 53f communicating with the second flow passages 46b and 56b on the outlet side are formed in the discharge tubes 43b and 53b and the plate portions 43a and 53a.

As illustrated in FIGS. 3, 5 and 6, protruding portions 42c, 43c, 52c and 53c protruding toward the cases 40 and 50 are formed on the plate portions 42a, 43a, 52a and 53a. Each protruding portion 42c, 43c, 52c and 53c is generally triangular, and includes an outer surface 42d, 43d, 52d and 53d and an inclined surface 42e, 43e, 52e and 53e, respectively. The protruding portions 42c, 43c and 52c, 53c are fitted into the first openings 41f and 51f. Each of the outer surface 42d, 43d, 52d and 53d makes contacts with an inner circumferential surface of the first openings 41f and 51f. The inclined surfaces 42e and 52e are inclined relative to the guide channels 42f and 52f such that, as the inclined surfaces 42e and 52e are farther from the guide channels 42f and 52f, the cross sections of the flow passages become larger. The inclined surfaces 43e and 53e are inclined relative to the discharge channels 43f and 53f such that, as the inclined surfaces 43e and 53e are closer to the discharge channels 43f and 53f, the cross sections of the flow passages become smaller.

As illustrated in FIGS. 5 and 6, the plate portions 42a, 43a, 52a and 53a define recesses along the first openings 41f and 51f. Seal members 47a, 47b, 57a and 57b for providing fluid tightness between the plate portions 42a, 43a, 52a and 53a, and the front walls 41c and 51c are accommodated in the recesses. The plate portions 42a, 43a, 52a and 53a are attached to outer surfaces of the front walls 41c and 51c with fittings such as screws.

As illustrated in FIGS. 3, 5 and 6, the return members 44 and 54 are made of resin and molded with a molding die. The return members 44 and 54 include plate portions 44a and 54a attached to the back walls 41d and 51d, and pairs of protruding portions 44c and 54c protruding from the plate portions 44a and 54a. The protruding portions 44c and 54c are generally triangular and include outer surfaces 44d and 54d and inclined surfaces 44e and 54e.

As illustrated in FIGS. 3, 5 and 6, the protruding portions 44c and 54c are fitted into the second openings 41g and 51g, and the outer surfaces 44d and 54d come into contact with inner circumferential surfaces of the second openings 41g and 51g. The inclined surfaces 44e and 54e are inclined relative to the opposed flow passages 46a, 46b, 56a and 56b toward the other flow passages 46a, 46b, 56a and 56b. Specifically, the inclined surface 44e is inclined to approach the plate portion 44a as the inclined surface 44e extends away from the outer surfaces 44d and the inclined surface 54e is inclined to approach the plate portion 54a as the inclined surface 54e extends away from the outer surfaces 54d. Accordingly, it is possible for a heat medium to smoothly return and flow from the first flow passages 46a and 56a on the inlet side to the second flow passages 46b and 56b on the outlet side. Recesses are formed along the second openings 41g and 51g in the plate portions 44a and 54a. Seal members 47c and 57c providing fluid tightness between the plate portions 44a and 54a and the back walls 41d and 51d are accommodated in the recesses. The plate portions 44a and 54a are attached to outer surfaces of the back walls 41d and 51d with fittings such as screws.

As illustrated in FIGS. 3 and 4, the case bodies 41 and 51 include a plurality of cylinder portions 41e and 51e protruding outward from the side walls 41b and 51b. Spacers or metal tubes 45 and 55 are provided in cylinder portions 41e and 51e. The metal tubes 45 and 55 are formed of metal such as brass and are inserted in molding the case bodies 41 and 51. The metal tubes 45 and 55 penetrate the cylinder portions 41e and 51e in a height direction. The first metal tube 45 includes a protruding end 45a protruding from the cylinder portion 41e to the second metal tube 55. The second metal tube 55 includes a protruding end 55a protruding from the cylinder portion 51e to the first metal tube 45. The second metal tube 55 has a smaller inner diameter than that of the first metal tube 45. A female thread is formed on an inner circumferential surface of the second metal tube 55.

As illustrated in FIG. 4, the case body 41 includes a first opposed portion 41n opposed to a first substrate 2b outside the first recess 41p. A recess 41m for the substrate for housing the first substrate 2b and an accommodating recess 41k for housing a first elastic member 8 are formed in the first opposed portion 41n. The case body 51 includes a second opposed portion 51n opposed to a second substrate 2c outside the recess 51p. A recess 51m for the substrate for housing the second substrate 2c and an accommodating recess 51k for housing a second elastic member 9 are formed in the second opposed portion 51n.

Figure 7:
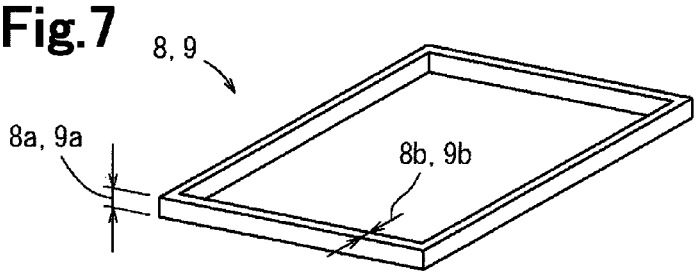
FIG. 7 is a perspective view of an elastic member.

As illustrated in FIG. 7, the elastic members 8 and 9 are made of rubber and are in the form of annular plates. The widths 8a and 9a of the elastic members 8 and 9 are larger than the thicknesses 8b and 9b of the elastic members 8 and 9. The elastic members 8 and 9 are formed in a manner to set the plate thicknesses 8a and 9a to a height direction and in a manner to be annular in a longitudinal direction. The elastic members 8 and 9 are formed in a square ring similar to the accommodating recesses 41k and 51k (see FIG. 4). The widths 8a and 9a are greater than the depths of the accommodating recesses 41k and 51k (see FIG. 4). Accordingly, the elastic members 8 and 9 contact with the substrates 2b and 2c of the thermoelectric module 2 in an elastically deformed state. The elastic deformation amounts of the elastic members 8 and 9 are approximately 1 mm, for example. The elastic members 8 and 9 provide fluid tightness between the substrates 2b and 2c and the case bodies 41 and 51.

As illustrated in FIG. 4, an annular recess is formed outside the thermoelectric modules 2 in the case body 41. A seal member 18 for providing fluid tightness between the case body 41 and the case body 51 is provided in the recess. As illustrated in FIG. 3, a pair of openings 48 is formed at the center of the top portion 41a of the case body 41. The openings 48 are covered with the converter case 6.

As illustrated in FIG. 3, the converter case 6 is made of aluminum and integrally includes a bottom portion 6a and an external wall 6b extending upward on the periphery of the bottom portion 6a. A plurality of ring portions 6c protruding outward is formed on the external wall 6b. The ring portions 6c contact with ends of the first metal tubes 45. As illustrated in FIG. 4, an annular recess is formed outside the opening 48 in the case body 41. A seal member 17 for providing fluid tightness between the case body 41 and the converter case 6 is provided in the recess.

As illustrated in FIGS. 2 and 4, the cases 40 and 50 and the converter case 6 are stacked in the thickness direction and joined by connectors 7. The connector or bolt 7 integrally includes a head portion 7a and a screw body 7b that is thinner than the head portion 7a. A male thread is formed on an outer circumferential surface of a screw body 7b. The screw body 7b penetrates through a hole 6d of the ring portion 6c and the first metal tube 45, and is threaded into the second metal tube 55. The head portion 7a contacts with an end of the ring portion 6c. Alternatively, the screw body 7b may penetrate through the first metal tube 45, may be threaded to the second metal tube 55, and the head portion 7a may make contact with the end of the first metal tube 45. By direct contact of the first metal tube (spacer) 45 with the second metal tube (spacer) 55, the distance between the first opposed portion 41n and the second opposed portion 51n is set to be L1.

As illustrated in FIG. 4, the thermoelectric module 2 includes thermoelectric devices (Peltier devices) 2a, the substrates 2b and 2c, and fins 2d and 2e. The thermoelectric device 2a is formed of different metals, conductors or semiconductors. The thermoelectric device 2a exerts the Peltier effect by the feed of direct current, absorbs heat while either one of a first heat side and a second heat side serves as a heat absorber, and dissipates heat while the other serves as a heat dissipator. A plurality of thermoelectric devices 2a is provided between the first and second substrates 2b and 2c. The first heat side of the thermoelectric device 2a contacts with and is soldered to the first substrate 2b, and the second heat side of the thermoelectric device 2a contacts with and is soldered to the second substrate 2c.

As illustrated in FIG. 4, the fins 2d and 2e protrude from the substrates 2b and 2c in a direction opposite to the thermoelectric device 2a. The fins 2d and 2e are in the form of plate and zigzag. Gaps 2f and 2g are formed between the zigzags. The gaps 2f and 2g extend in longitudinal directions of the flow passages 46a, 46b, 56a and 56b in order not to block the flow passages 46a, 46b, 56a and 56b.

As illustrated in FIG. 2, a converter 16 is mounted on the converter case 6. The converter 16 is electrically connected to terminals 49 extending from the case body 41. The converter 16 converts a voltage input to the converter 16 into a predetermined voltage to supply direct current to the terminals 49. Direct current is supplied to the thermoelectric device 2a of the thermoelectric modules 2 (see FIG. 4) via non-illustrated wiring extending from the terminals 49 within the case body 41. The supply of current causes the thermoelectric device 2a to absorb heat via the first fin 2d and the first substrate 2b, and dissipate heat via the second substrate 2c and the second fin 2e.

As illustrated in FIG. 1, the first heat medium is supplied by the pump 13 to the first case 40 via the pipes 20 and 21. As illustrated in FIGS. 2 and 3, the first heat medium is introduced from the guide channel 42f to the first flow passage 46a on the inlet side, and is discharged from the discharge channel 43f via the second flow passage 46b on the outlet side. The first heat medium flows through the flow passages 46a and 46b and accordingly receives cold from the thermoelectric device 2a via the first fin 2d and the first substrate 2b (see FIG. 4).

As illustrated in FIG. 1, the second heat medium is supplied by the pump 15 to the second case 50 via the pipe 22. As illustrated in FIGS. 2 and 3, the second heat medium is introduced from the guide channel 52f to the first flow passage 56a on the inlet side, and is discharged from the discharge channel 53f via the second flow passage 56b on the outlet side. The second heat medium flows through the flow passages 56a and 56b and accordingly receives heat from the thermoelectric device 2a via the second fin 2e and the second substrate 2c (see FIG. 4). As illustrated in FIG. 1, the second heat medium flows through the indoor heat exchanger 14 to release heat into the indoor air.

As illustrated in FIG. 3, the flow direction of the first heat medium in the first case 40 is opposed to the flow direction of the second heat medium in the second case 50. Therefore, a difference between the heat absorption side and heat dissipation side of the thermoelectric module 2 is small between the thermoelectric modules 2. Accordingly, the overall thermal efficiency is high.

As illustrated in FIGS. 2 and 3, the first heat medium contacts with the converter case 6 via the openings 48 of the case body 41. The first heat medium receives the heat emitted from the converter 16 via the converter case 6. Therefore, the first heat medium cools the converter 16.

As described above, as illustrated in FIGS. 3 and 4, the thermoelectric conversion unit 1 includes: the first case 40 including the first recess 41p defining the first flow passages 46a and 46b; the second case 50 including the second recess 51p defining the second flow passages 56a and 56b; the first substrate 2b covering the opening of the first recess 41p; the second substrate 2c opposed to the first substrate 2b and covering the opening of the second recess 51p; a plurality of thermoelectric devices 2a in contact with inner surfaces of the first and second substrates 2b and 2c; the connectors 7 for joining the first and second cases 40 and 50; the first fins 2d protruding from the first substrate 2b in the first flow passages 46a and 46b of the first case 40; and the second fins 2e protruding from the second substrate 2c in the second flow passages 56a and 56b of the second case 50. The first case 40 includes the first opposed portions 41n opposed to the first substrate 2b outside the first recess 41p. The second case 50 includes the second opposed portions 51n opposed to the second substrate 2c outside the second recess 51p. The accommodating recesses 41k and 51k for housing the elastic members 8 and 9 are formed in the first and second opposed portions 41n and 51n. The elastic members 8 and 9 contact with both of a bottom portion of the accommodating recess 41k and an outer surface of the first substrate 2b and both of the bottom portion of the accommodating recess 51k and an outer surface of the second substrate 2c. The spacers 45 and 55 for setting the distance L1 between the first opposed portion 41n and the second opposed portion 51n are provided. The spacers set the distance L1 between the first and second opposed portions 41n and 51n to be longer than the distance L2 between the outer surface of the first substrate 2b and the outer surface of the second substrate 2c.

Therefore, the binding power of the connectors 7 for joining the first and second cases 40 and 50 is received by the spacers 45 and 55. Accordingly, the binding power of the connectors 7 is not applied, but only the elasticity of the elastic members 8 and 9 are applied to the first and second substrates 2b and 2c. Hence, it is possible to prevent the thermoelectric device 2a provided between the first and second substrates 2b and 2c from being damaged by the biding power of the connectors 7.

As illustrated in FIG. 4, the connectors 7 are bolts. The spacers include the first metal tube 45 provided in the first case 40 for inserting the bolt into the tube 45, and the second metal tube 55 provided in the second case 50 for inserting the bolt into the tube 55. Therefore, the binding power of the bolts or the connectors 7 can securely be received by the first and second metal tubes 45 and 55 that contact with each other.

As illustrated in FIG. 4, the accommodating recesses 41k and 51k are formed in both of the first and second opposed portions 41n and 51n. The elastic members include the first elastic member 8 provided in the accommodating recess 41k of the first opposed portion 41n and the second elastic member 9 provided in the accommodating recess 51k of the second opposed portion 51n. Therefore, the first and second elastic members 8 and 9 can elastically hold the first and second substrates 2b and 2c where the thermoelectric devices 2a are provided between the first and second substrates 2b and 2c in both thickness directions. Accordingly, it is possible to inhibit external forces from being applied to the thermoelectric devices 2a.

As illustrated in FIGS. 4 and 7, the first and second elastic members 8 and 9 are formed of plate members extending in a vertical direction relative to the first and second substrates 2b and 2c. Therefore, it is easy for the elastic members 8 and 9 to be elastically deformed in the vertical direction relative to the first and second substrates 2b and 2c, and to be elastically deformed in a binding direction of the connector 7. Hence, the elasticity of the elastic members 8 and 9 applied to the first and second substrates 2b and 2c is small. Accordingly, it is possible to set forces applied to the thermoelectric devices 2a to be small.

As illustrated in FIGS. 4 and 7, the first and second elastic members 8 and 9 are annular, and provide fluid tightness between the corresponding opposed portion 41n and 51n of the cases 40 and 50 and substrates 2b and 2c. Therefore, the elastic members 8 and 9 have not only a function for elastically holding the thermoelectric modules 2 but also function for providing fluid tightness between the cases 40 and 50 and the substrates 2b and 2c.

As illustrated in FIG. 3, the first and second cases 40 and 50 include the case bodies 41 and 51 made of resin, respectively. Therefore, the cases 40 and 50 can be molded into a complicated shape compared with a case where the case bodies 41 and 51 are formed of metal.

As illustrated in FIG. 4, the first and second metal tubes 45 and 55 include the protruding ends 45a and 55a protruding from the corresponding case bodies 41 and 51 toward the other metal tubes 45 and 55 to contact with the other metal tubes 45 and 55. Therefore, the first and second metal tubes 45 and 55 can prevent contacting of the case bodies 41 and 51 by the protruding ends 45a and 55a. Accordingly, it is possible to avoid the release of the connector 7 from the cases 40 and 50, the release being caused by a return from the elastic deformation of the case bodies 41 and 51 made of resin.

The present invention is not limited to the above embodiment, and may be embodied as follows.

For example, the heat exchange system 10 may be used for the heating or cooling of the interior of a vehicle. When the heat exchange system 10 is used for cooling, the first case 40 is connected to the pipe 22, and the second case 50 is connected to the pipe 21.

The heat exchange system 10 may be used for the air conditioning of the interior of a vehicle, may be used for the cooling or heating of vehicle parts such as a battery, or may be used for the cooling or heating of products other than a vehicle.

The case bodies 41 and 51 may be made of resin or die casting aluminum.

Baffle plates for changing the flow of the heat medium may be integrally provided with the guide members 42 and 52, the discharge members 43 and 53, or the return members 44 and 54.

Both elastic members 8 and 9 may be provided between the thermoelectric module 2 and the case bodies 41 and 51. Alternatively, either one of the elastic members 8 and 9 may be provided. Alternatively, the substrates 2b and 2c may be elastically held by the case bodies 41 and 51 through a liquid gasket. Alternatively, the accommodating recesses 41k and 51k in the case bodies 41 and 51 may be omitted, and elastic members may be provided between the case bodies 41 and 51 and the substrates 2b and 2c. Alternatively, either of the accommodating recesses 41k or 51k may be formed to be provided with an elastic member The heat medium supplied to the cases 40 and 50 may be fluid or gas.

The cases 40 and 50 may include the case bodies 41 and 51 made of resin and the metal tubes 45 and 55 made of metal. Alternatively, the case bodies 41 and 51 may integrally or separately include the case bodies 41 and 51 made of metal and the metal tubes 45 and 55. Alternatively, the cases 40 and 50 may cause a part of the case bodies 41 and 51 to function as spacers.

The connector 7 may be threadedly connected to the second metal tube 55, or the screw body 7b may penetrate the second metal tube 55 and a distal end of the screw body 7b may be threadedly connected to a nut so that the nut may by placed in contact with an end of the second metal tube 55.

The metal tubes 45 and 55 may include the protruding ends 45a and 55a respectively, or either of the metal tubes 45 or 55 may include a protruding end.

The recesses for the substrate 41m and 51m may be formed in the cases 40 and 50 respectively, or recesses for the substrate for housing the central parts of the thermoelectric modules 2 may be formed in only one of the cases 40 and 50.

The elastic members 8 and 9 may or may not be annular. The elastic members 8 and 9 may have the shape illustrated in FIG. 7 or another shape, or either of the elastic members 8 or 9 may have the shape illustrated in FIG. 7.

What is claimed is:

1. A thermoelectric conversion unit comprising:
a first case including a first recess, wherein the first recess defines a first flow passage and has an opening;
a second case including a second recess, wherein the second recess defines a second flow passage and has an opening;
a first substrate covering the opening of the first recess, wherein the first substrate includes an inner surface and an outer surface;
a second substrate opposed to the first substrate and covering the opening of the second recess, wherein the second substrate includes an inner surface and an outer surface;
a plurality of thermoelectric devices in contact with the inner surfaces of the first and second substrates;
a connector for joining the first and second cases;
a first fin protruding from the first substrate in the first flow passage of the first case; and
a second fin protruding from the second substrate in the second flow passage of the second case, wherein
the first case includes a first opposed portion opposed to the first substrate outside the first recess,
the second case includes a second opposed portion opposed to the second substrate outside the second recess,
an accommodating recess is formed in at least one of the first and second opposed portions, wherein the accommodating recess has a bottom portion,
an elastic member is housed in the accommodating recess, wherein the elastic member makes contacts with both the bottom portion of the accommodating recess and the outer surface of the first substrate or both the bottom portion of the accommodating recess and the outer surface of the second substrate, and
a spacer for setting distance between the first opposed portion and the second opposed portion, the spacer setting the distance between the first and second opposed portions to be longer than distance between the outer surface of the first substrate and the outer surface of the second substrate is provided.

2. The thermoelectric conversion unit according to claim 1, wherein
the connector is a bolt, and
the spacer includes a first metal tube, provided in the first case, for inserting the bolt thereinto, and a second metal tube, provided in the second case, for inserting the bolt thereinto.

3. The thermoelectric conversion unit according to claim 1, wherein
the accommodating recesses are formed in both the first opposed portion and the second opposed portion, and
the elastic member includes a first elastic member provided in the accommodating recess of the first opposed portion and a second elastic member provided in the accommodating recess of the second opposed portion.

4. The thermoelectric conversion unit according to claim 3, wherein at least one of the first elastic member and second elastic member is a plate member extending in a vertical direction relative to the first substrate or the second substrate.

5. The thermoelectric conversion unit according to claim 3, wherein
at least one of the first elastic member and the second elastic member is annular, and provides fluid tightness between the corresponding opposed portion of the case and the substrate.

6. The thermoelectric conversion unit according to claim 1, wherein
each of the first case and the second case includes a case body made of resin.

7. The thermoelectric conversion unit according to claim 6, wherein
at least one of the first metal tube and the second metal tube includes a protruding end portion protruding from the corresponding case body toward the other metal tube to contact with the other metal tube.

* * * * *